United States Patent
Mlcousek et al.

(10) Patent No.: US 7,453,298 B1
(45) Date of Patent: Nov. 18, 2008

(54) PWM CONTROLLER AND METHOD THEREFOR

(75) Inventors: Radim Mlcousek, Frenstat (CZ); Pavel Latal, Roznov (CZ)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 10 days.

(21) Appl. No.: 11/780,611

(22) Filed: Jul. 20, 2007

(51) Int. Cl.
*H03K 3/017* (2006.01)

(52) U.S. Cl. .......................... 327/172; 327/37; 327/175; 327/177; 375/238

(58) Field of Classification Search ......... 327/172–175, 327/177, 31, 35, 37; 332/109, 111; 375/238
See application file for complete search history.

(56) References Cited

U.S. PATENT DOCUMENTS

| | | | |
|---|---|---|---|
| 6,982,574 B2 * | 1/2006 | Harriman et al. | 327/108 |
| 2006/0055387 A1 * | 3/2006 | Steele | 323/283 |
| 2007/0170902 A1 * | 7/2007 | Chen et al. | 323/282 |

\* cited by examiner

*Primary Examiner*—An T Luu
(74) *Attorney, Agent, or Firm*—Robert F. Hightower (57) ABSTRACT

In one embodiment, a PWM controller is configured to form a control signal that has reduced noise. The control signal is used to adjust a frequency of a clock signal of the PWM controller.

16 Claims, 6 Drawing Sheets

PWM CONTROLLER AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to form pulse width modulated (PWM) power supply controllers there were used in a power supply system to regulate an output voltage to a desired value. In some cases, the PWM controllers used an external component to set the value of some of the operating parameters of the PWM controller. For example, an external resistor may have been utilized to set an operating frequency of a master clock of the PWM controller. One problem with the prior PWM controllers was that switching of the inductors of the power supply system and switching of the power transistors that controlled current through the inductors often generated noise that coupled through parasitic components into the voltages or currents that were formed by the external components. The switching induced noise often resulted in the desired parameter having an incorrect value.

Accordingly, it is desirable to have a PWM controller that utilizes external components to more accurately set parameters of the PWM controller.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
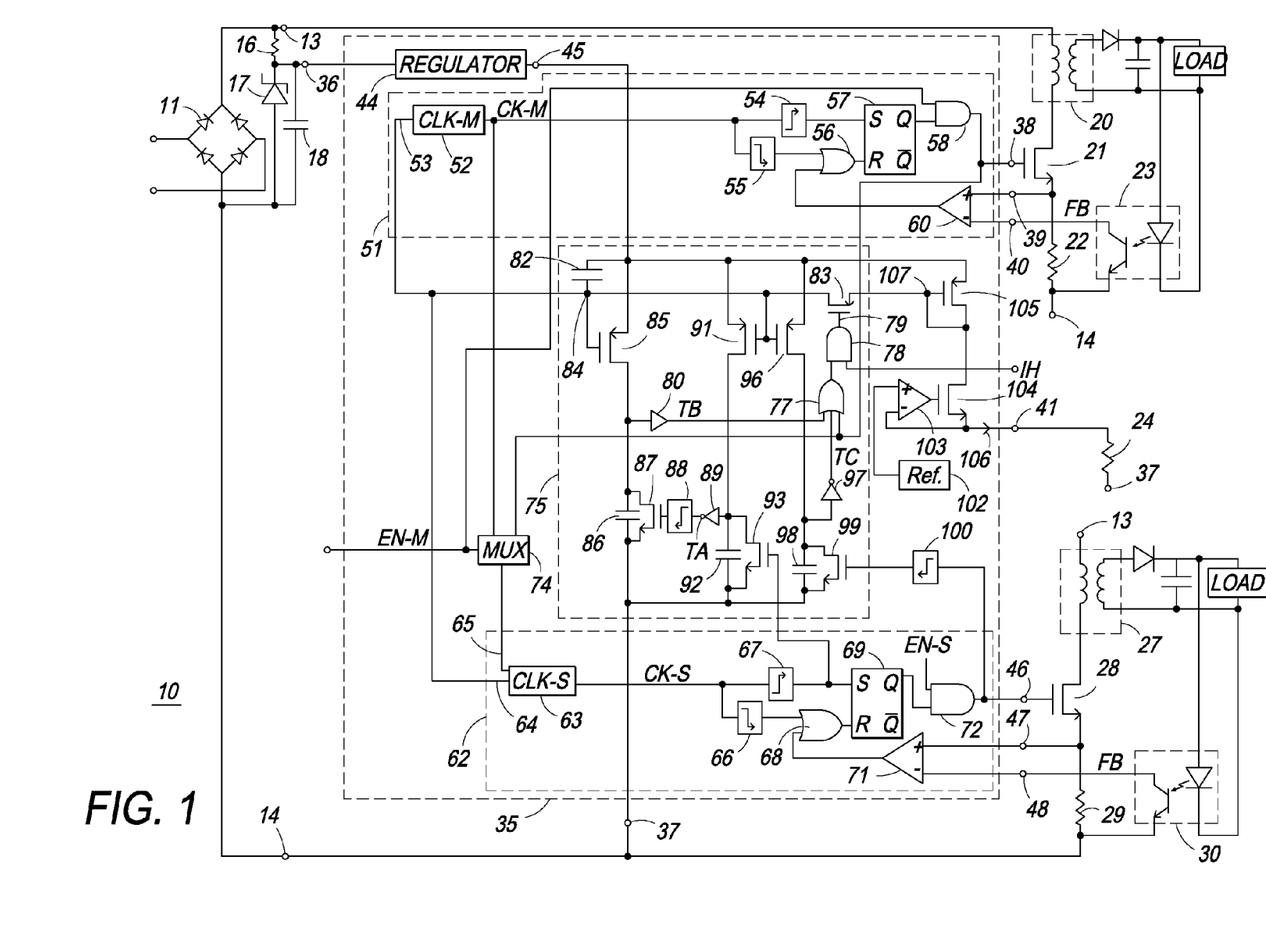
FIG. 1 schematically illustrates an embodiment of a portion of a power supply system having a PWM controller according to the present invention.

FIG. 1 schematically illustrates an embodiment of a portion of a power supply system 10 that includes an exemplary embodiment of a PWM power supply controller or PWM controller 35. System 10 receives input power, such as from a household mains, that is applied to a bridge rectifier 11 and forms a bulk input voltage from bridge rectifier 11 that is received between a bulk input terminal 13 and a bulk return terminal 14. A pre-regulator that includes a resistor 16, a zener diode 17, and a capacitor 18 may be utilized to form a voltage that is used as an input voltage for controller 35. System 10 has two channels that each provide a regulated output voltage. A first channel includes a transformer 20 that has a primary inductor that is controlled by a power switch, such as a power transistor 21, and a secondary inductor that provides a first output voltage, through a diode and a capacitor, to a load. A first feedback voltage that is representative of the first output voltage of the first channel is formed by an optical coupler 23. A resistor (not shown) may be included within controller 35 as a pull-up of the output of opto-coupler 23. A current sense resistor 22 forms a first current sense signal that is representative of the current through transistor 21. A second channel of system 10 forms a second output voltage that is regulated independently of the value of the first output voltage. The second channel includes a transformer 27 that has a primary conductor that is controlled by a power switch, such as a power transistor 28, and a secondary inductor that provides a second output voltage, through a diode and a capacitor to load. A second feedback voltage that is representative of the second output voltage of the second channel is formed by an optical coupler 30. A current sense resistor 29 forms a second current sense signal that is representative of the current through transistor 28.

Controller 35 is configured to form a control voltage, on an input 41, that is utilized to adjust or set the frequency of the clocks that are used to control the period of the PWM drive signals of controller 35. Controller 35 includes a voltage input 36 and a voltage return 37 that are used for receiving power for operating controller 35. Input 36 generally is connected to receive power from the pre-regulator of resistor 16, diode 17, and capacitor 18. Return 37 generally is connected to return terminal 14. Controller 35 also includes a first PWM drive output 38 that is connected to drive transistor 21, a first current sense input 39 that is connected to receive the first current sense signal from resistor 22, a first feedback input 40 that is connected to receive the first feedback signal from coupler 23, input 41 that is connected to an external resistor 24, a second PWM drive output 46 that is connected to drive transistor 28, a second current sense input 47 that is connected to receive the second current sense signal from resistor 29, and a second feedback input 48 that is connected to receive the second feedback signal from coupler 30. A first PWM channel 51 of controller 35 is configured to form the first PWM drive signal on output 38 and a second PWM channel 62 is configured to form the second PWM drive signal on output 46. A voltage-to-current conversion circuit of controller 35 includes an amplifier 103 and transistors 104 and 105 are configured to form a control voltage on output 41. The voltage-to-current converter also uses the control voltage to form a control signal that is used to adjust the frequency of channels 51 and 62 as will be seen further hereinafter. A signal conditioning circuit 75 is utilized to remove noise from the control voltage and convert the control voltage to a more stable control signal that is utilized to adjust the frequency of the clock signals as will be seen further hereinafter.

Channel 51 includes a master clock (CLK-M) circuit 52 that is used to form a master clock (CK-M) signal on output of circuit 52. Circuit 52 receives the control signal on an input 53 and uses the value of the control signal to adjust the operating frequency of the master clock signal (CK-M). Channel 51 also includes a PWM latch 57, a sense comparator 60, an output driver gate 58 that is used to form the first PWM drive signal, and logic that includes an OR gate 56, a positive edge detector 54, and a negative edge detector 55. The output of positive edge detector 54 remains low until there is a low-to-high transition of the CK-M signal. Detector 54 senses the positive transition and forms a short pulse that is used to set latch 57. Similarly, the output of negative edge detector 55 remains low until there is a high-to-low transition of the CK-M signal. Detector 55 senses the negative transition and forms a short pulse that is used to assist in resetting latch 57. Second PWM Channel 62 includes a slave clock (CLK-S) circuit 63 that is utilized to form a slave clock signal (CK-S) on output of circuit 63. Second PWM channel 62 also includes a PWM latch 69, a sense comparator 71, an output driver gate 72, and logic that includes an OR gate 68, a negative edge detector 66, and a positive edge detector 67. As will be seen further hereinafter slave clock circuit 63 is configured to be synchronized to either the first PWM drive signal or the CK-M signal. If channel 51 is generating the first PWM drive signal, the first PWM drive signal is transmitted through a multiplexer (MUX) 74 to slave clock circuit 63. Circuit 63 generates the slave clock signal (CK-S) on the trailing edge of each of the first PWM drive signals. However, if the first PWM drive signal is disabled, such as via gate 58, MUX 74 transmits the CK-M signal to slave clock circuit 63 and circuit 63 generates the CK-S signal upon each negative edge of the CK-M signal. Thus, the slave clock signal (CK-S) is synchronized to the negative edge of the master clock (CK-M) signal.

Signal conditioning circuit 75 includes a switch transistor 83, a signal conditioning capacitor 82, and three timing circuits. The first timing circuit forms a first timing signal TA and includes transistors 91 and 93, a timing capacitor 92, an inverter 89, and a negative edge detector 88. The second timing circuit forms a second timing signal TB and includes transistors 85 and 87, a timing capacitor 86, and a buffer 80. The third timing circuit forms a third timing signal TC and includes transistors 96 and 99, a timing capacitor 98, and an inverter 97. Circuit 75 also includes OR gate 77 and AND gate 78.

Controller 35 usually includes an internal regulator 44 that is used to form an internal operating voltage for operating elements of controller 35 such as for operating amplifier 103, MUX 74, circuit 52, circuit 63, and other elements of controller 35. Regulator 44 generally is connected to receive the input voltage between input 36 and return 37 and responsively form the internal operating voltage on an output 45 of regulator 44. Controller 35 also generally includes enable signals that can be utilized to inhibit the operation of either the first PWM drive signal or the second PWM drive signal. For example, a master enable signal (EN-M) may be used to force the output of gate 58 low in order to inhibit forming the first PWM drive signal. In such a case, the EN-M signal is also used to control MUX 74 to select the CK-M signal to circuit 63 instead of selecting the first PWM drive signal. Also, a slave enable signal (EN-S) may be used to force the output of gate 72 low in order to inhibit forming the second PWM drive signal. The EN-M and/or the EN-S signals may be received from external to controller 35 or may be received from other circuitry (not shown) that may be a part of controller 35. For example, an over-voltage protection circuit that monitors the value of the first output voltage formed by the first PWM channel may be utilized to form the EN-M signal. Controller 35 may also receive an inhibit signal (IH) that can be used to inhibit coupling capacitor 82 to receive the control voltage. Such an inhibit signal preferably is asserted once during start-up of the circuit and generally solely for the purpose of allowing capacitor 82 to charge for the very first time. Typically, such an inhibit signal is generated internally to controller 35.

Figure 2:
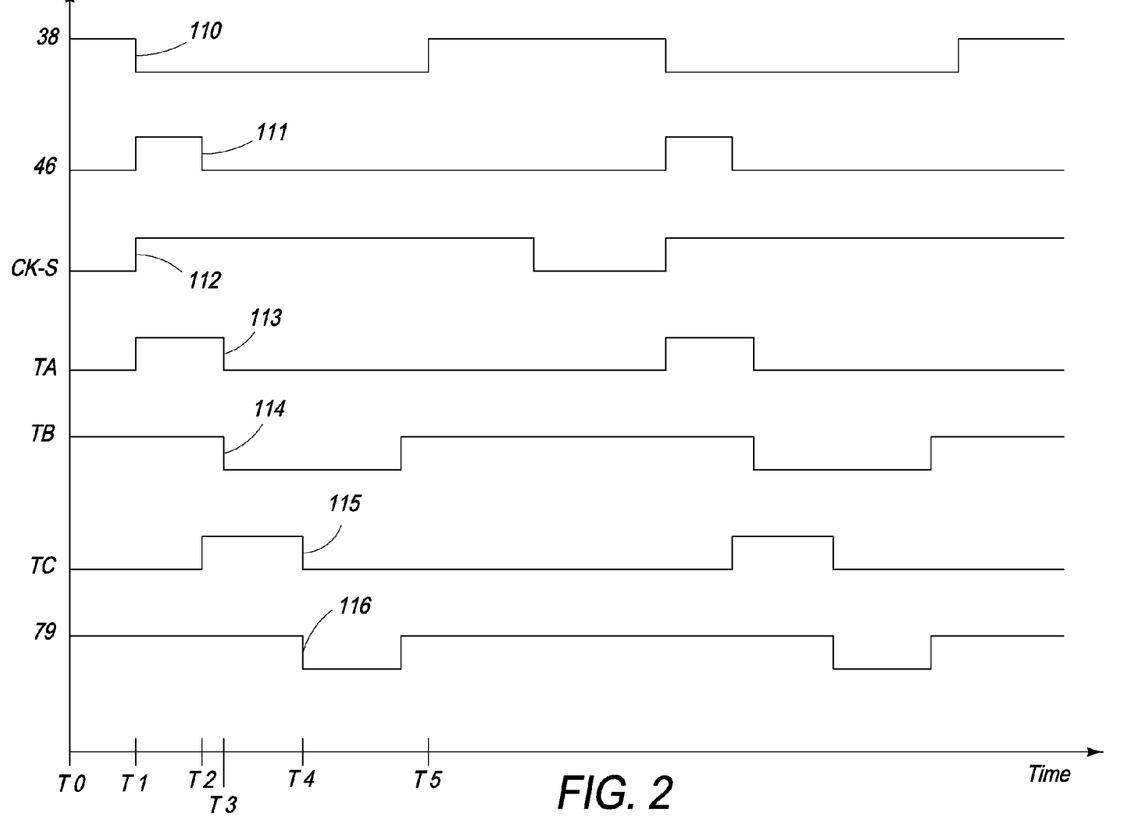
FIG. 2 is a graph having plots that illustrate a state of some of the signals generated within the PWM controller of FIG. 1 in accordance with the present invention.

FIG. 2 is a graph having plots that illustrate certain states of some of the signals that are generated during the operation of controller 35. The abscissa indicates time and the ordinate indicates increasing value of the illustrated signal. A plot 110 illustrates the first PWM drive signal on output 38. A plot 111 illustrates the second PWM drive signal on output 46 and a plot 112 illustrates the slave clock signal CK-S. Plots 113, 114, and 115 illustrate the TA, TB, and TC timing signals, respectively, that are generated by the respective first, second, and third timing circuits of circuit 75. A plot 116 illustrates a decouple signal that is formed at a node 79 and that is applied to switch transistor 83. This description has references to FIG. 1 and FIG. 2. Amplifier 103 and transistor 104 are connected as a voltage-to-current converter that forms a sense voltage on input 41 that is substantially the value of the reference voltage received from a reference generator or ref 102. The value of the sense voltage formed on input 41 forms a current 106 that flows through resistor 24. The value of current 106 is determined by the resistance value of resistor 24. Resistor 24 is connected to return 37 because reference 102 is also referenced to return 37. Current 106 also flows through transistor 105 which forces a gate-to-source voltage for transistor 105 on a node 107. The voltage on node 107 is used as a control voltage for circuit 75. As can be seen, the value of the control voltage on node 107 changes as the value of current 106 changes and the value of current 106 is determined by the value of resistor 24, thus, the value of resistor 24 determines the value of the control voltage on node 107. As transistors 21 and 28 switch during the regulation of the first and second output voltages, noise created by the switching of transistors 21 and 28 is coupled through parasitic capacitances to resistor 24 thereby affecting the value of the control voltage formed on node 107. If the noise increases the voltage across resistor 24, the value of current 106 will decrease and the value of the control voltage on node 107 will decrease. If the value of this control voltage were directly applied to master clock circuit 52 or slave clock circuit 63, the frequency of the two clock circuits would change as a result of the noise thereby causing inaccurate periods for the PWM drive signals and inaccurate regulation of the output voltages. Signal conditioning circuit 75 is configured to remove these noise perturbations from the control voltage and form a control signal on a node 84 that does not have these disturbances created by the noise that is coupled to resistor 24.

For the purpose of explaining the operation of controller 35, assume that at a time T0 the master enable (EN-M) signal, the slave enable (EN-S) signal, and the inhibit signal (IH) are high and that the output of gate 58 follows the output of latch 57. Also, assume that latch 57 is set and the first PWM drive signal on output 38 is high and the second drive signal on output 46 is low. Since output 38 is high, the output of gate 77 is high and the decouple signal on node 79 is high, thus, transistor 83 is disabled and capacitor 82 is decoupled from receiving the control voltage on node 107. At a time T1, the current through transistor 21 reaches a value that causes the output of comparator 60 to go high which resets latch 57 and forces output 38 low. The low from output 38 propagates through MUX 74 and forces the CK-S signal on the output of slave clock circuit 63 high. Note that since TB is high, the low from output 38 does not affect the decouple signal on node 79. Positive edge detector 67 receives the positive going CK-S signal and forms a short pulse that sets latch 69 thereby forcing the second PWM drive signal on output 46 high. The short pulse created by positive edge detector 67 also briefly enables transistor 93 which quickly discharges capacitor 92 forces the TA timing signal on the output of inverter 89 high. The TA timing signal remains high as capacitor 92 charges. Since TA is high, transistor 87 is disabled and capacitor 86 is charged by transistor 85, thus, the TB timing signal remains high. Also note that because output 46 is high, negative edge detector 100 is low, thus, transistor 99 is disabled and capacitor 98 remains charged by transistor 96. Assume that at a time T2 the output of coupler 30 become sufficient to force the output of comparator 71 high thereby resetting latch 69 and forcing output 46 low. Note that this transition of output 46 occurs before the time interval of charging capacitor 92 has expired. The high-to-low transition on output 46 forces the output of edge detector 100 high for a short period time thereby discharging capacitor 98 which forces the TC signal on the output of inverter 97 high. The high TC signal forces the output of gate 77 high thereby maintaining the decouple signal on node 79 high. The high decouple signal ensures that transistor 83 is disabled so that the control voltage on node 107 is not coupled to capacitor 82 during the time that transistor 28 is being disabled by the second PWM drive signal on output 46. Subsequently, the time interval required to charge capacitor 92 expires and forces TA low as illustrated at time T3. Negative edge detector 88 detects the negative transition of TA and forms a short pulse that enables transistor 87 and discharges capacitor 86 thereby forcing TB low. The low TB signal has no effect on gate 77 because TC remains high. At a time T4 the time interval required to charge capacitor 98 expires forcing the TC timing signal low. The low TC signal and the low TB signal force the output of gate 77 low thereby forcing node 79 low and enabling transistor 83 to couple the control voltage from node 107 to capacitor 82 and to charge capacitor 82 to the value of the control voltage during a time when transistors 21 and 28 are not switching and coupling noise to resistor 24. The time interval selected for charging capacitor 92 is chosen to ensure that the TB signal will not go low until a sufficient time, for example the time interval of signal TA, after transistor 28 is enabled thereby ensuring that noise from the switching of transistor 28 has decayed prior to connecting capacitor 82 to be charged to the control voltage on node 107. The time interval chosen for charging capacitor 86 ensures that TB is low for a time period that is sufficient to charge capacitor 82.

Note that if the second PWM drive signal on output 48 had not gone low until a time after T3, the TB signal would go low responsively to TA going low to couple capacitor 82 to receive the control voltage. Subsequently, when output 46 went low, negative edge detector 100 would enable transistor 99 and force TC high to decouple capacitor 82 from receiving the control voltage. This would decouple capacitor 82 from the control voltage while transistor 28 was switching thereby providing a stable control signal on node 84.

At a time T5, assume that the master clock (CK-M) signal goes high and sets latch 57 thereby forcing the first PWM drive signal on output 38 high. The high from output 38 forces the output of gate 77 high thereby forcing the decouple signal on node 79 high and disabling transistor 83. Thus, while transistor 21 is switching, capacitor 82 is decoupled from the control voltage on node 107. As long as the first PWM drive signal is high, transistor 83 remains disabled. When the first PWM drive signal again goes low at a time T6, the low transition initiates another cycle of the slave clock (CK-S) thereby forcing the CK-S signal high and again forcing the TA timing signal high as was previously explained at time T1. It should be noted that generally, the width of the positive portion of signals TA and TC and the width of the negative portion of signal TB are proportional to the frequency of the CK-S signal. Thus, the widths are a specific percentage of the period of the CK-S signal.

Figure 3:
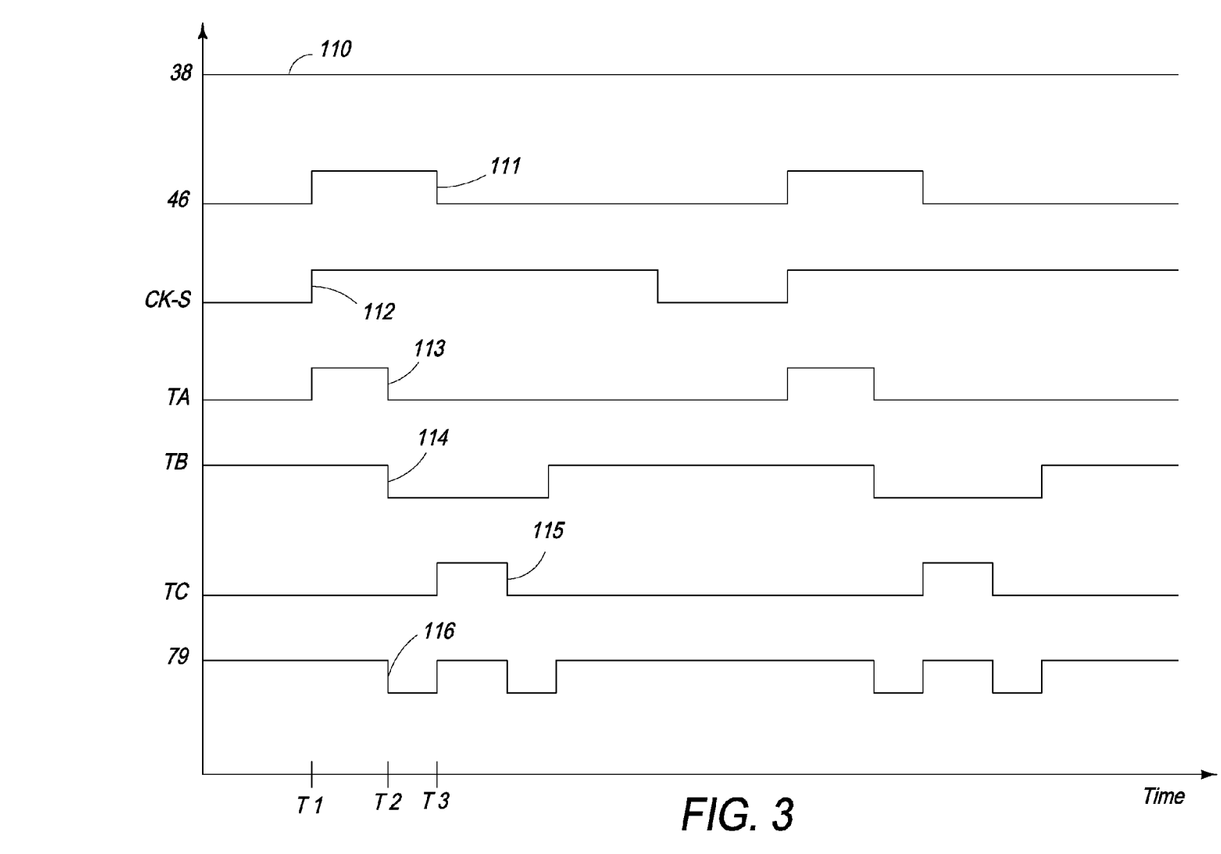
FIG. 3 is a graph having plots that illustrate other states of signals generated within the PWM controller of FIG. 1 in accordance with the present invention.

FIG. 3 is a graph having plots that illustrate different states of some of the signals that are generated during the operation of controller 35. The abscissa indicates time and the ordinate indicates increasing value of the illustrated signal. Assume that at a time T0 the master enable (EN-M) signal is low and that the slave enable (EN-S) signal and the inhibit (IH) signal are high. The low EN-M signal forces the output of gate 58 low thereby forcing output 38 low to disable transistor 21. The low EN-M signal also controls MUX 74 to select the CK-M signal to initiate the CK-S signal. Since output 38 is low, it has no effect on gate 77. At a time T1, CK-M signal goes low which propagates through MUX 74 and forces the CK-S signal on the output of slave clock circuit 63 high. Positive edge detector 67 receives the positive going CK-S signal and forms a short pulse that sets latch 69 thereby forcing the second PWM drive signal on output 46 high. The short pulse created by positive edge detector 67 also briefly enables transistor 93 which quickly discharges capacitor 92 forces the TA timing signal on the output of inverter 89 high. The TA timing signal remains high as capacitor 92 charges. Since TA is high, transistor 87 is disabled and capacitor 86 is charged by transistor 85, thus, the TB timing signal remains high. Also note that because output 46 is high, negative edge detector 100 is low, thus, transistor 99 is disabled and capacitor 98 remains charged by transistor 96. At a time T2, the time interval required to charge capacitor 92 expires and forces TA low. Negative edge detector 88 detects the negative transition of the TA signal and forms a short pulse that enables transistor 87 and discharges capacitor 86 thereby forcing the TB timing signal low. The low TB signal forces the output of gate 77 low thereby forcing node 79 low and enabling transistor 83 to couple the control voltage from node 107 to capacitor 82 and to charge capacitor 82 to the value of the control voltage during a time when transistors 21 and 28 are not switching and coupling noise to resistor 24.

At a time T3, the output of coupler 30 becomes sufficient to force the output of comparator 71 high thereby resetting latch 69 and forcing output 46 low. The high to low transition on output 46 forces the output of edge detector 100 high for a short period time thereby discharging capacitor 98 which forces the TC signal on the output of inverter 97 high. The high TC signal forces the output of gate 77 high thereby forcing the decouple signal on node 79 high. The high disables transistor 83 and decouples capacitor 82 from the control voltage on node 107 during the time that transistor 28 is being disabled by the second PWM drive signal on output 46.

In order to provide this functionality for controller 35, regulator 44 is connected between input 36 and return 37 in order to generate the operating voltage on output 45. The output of circuit 52 is commonly connected to an input of detector 54, an input of detector 55, and a first input of MUX 74. The output of detector 54 is connected to the set input of latch 57. The output of detector 55 is connected to a first input of gate 56 which has a second input connected to the output of comparator 60. An inverting input of comparator 60 is connected input 40 and a non-inverting input is connected to input 39. The output of gate 56 is connected to the reset input of latch 57. A Q output of latch 57 is connected to a first input of gate 58. A second input of gate 58 is commonly connected to the control input of MUX 74 and connected to receive the EN-M signal. The output of gate 58 is commonly connected to output 38, a first input of gate 77, and a second input of MUX 74. An output of MUX 74 is connected to input 65 of circuit 63. The output of circuit 63 is commonly connected to an input of detector 66 and an input of detector 67. An output of detector 66 is connected to a first input of gate 68 which has a second input connected to the output of comparator 71. An inverting input of comparator 71 is connected to input 48 and a non-inverting input is connected to input 47. An output of gate 68 is connected to a reset input of latch 69. A set input of latch 69 is commonly connected to an output of detector 67 and a gate of transistor 93. A Q output of latch 69 is connected to a first input of gate 72. A second input of gate 72 is connected to receive the EN-S signal. The output of gate 72 is commonly connected to output 46 and an input of detector 100. An output of detector 100 is connected to a gate of transistor 99. The source of transistor 99 is connected to a first terminal of capacitor 98 and to return 37. A drain of transistor 99 is commonly connected to a first input of inverter 97, a second terminal of capacitor 98, and a drain of transistor 96. A source of transistor 96 is connected to output 45 of regulator 44 and to the source of transistor 105. A drain of transistor 105 is commonly connected to a gate of transistor 105, a source of transistor 83, and a drain of transistor 104. A source of transistor 104 is connected to input 41 and an inverting input of amplifier 103. A non-inverting input of amplifier 103 is connected to an output of ref 102. An output of amplifier 103 is connected to the gate of transistor 104. A drain of transistor 83 is commonly connected to a gate of transistor 96, a gate of transistor 91, a gate of transistor 85, node 84, a first terminal of capacitor 82, input 53 of circuit 52, and input 64 of circuit 63. A second terminal of capacitor 82 is connected to output 45. A gate of transistor 83 is connected to node 79 and the output of gate 78. A first input of gate 78 is connected to receive the inhibit (IH) signal and a second input is connected to an output of gate 77. A second input of gate 77 is connected to an output of inverter 97. A third input of gate 77 is connected to an output of buffer 80 which has an input commonly connected to a drain of transistor 85, a drain of transistor 87, and a first terminal of capacitor 86. A drain of transistor 85 is connected to output 45. A second terminal of capacitor 86 is commonly connected to return 37 and a source of transistor 87. A gate of transistor 87 is connected to an output of detector 88 which has an input connected to an output of inverter 89. An input of inverter 89 is commonly connected to a drain of transistor 91, a drain of transistor 93, and a first terminal of capacitor 92. A second terminal of capacitor 92 is connected to a source of transistor 93 and to return 37. A source of transistor 91 is connected to output 45 of regulator 44.

Figure 4:
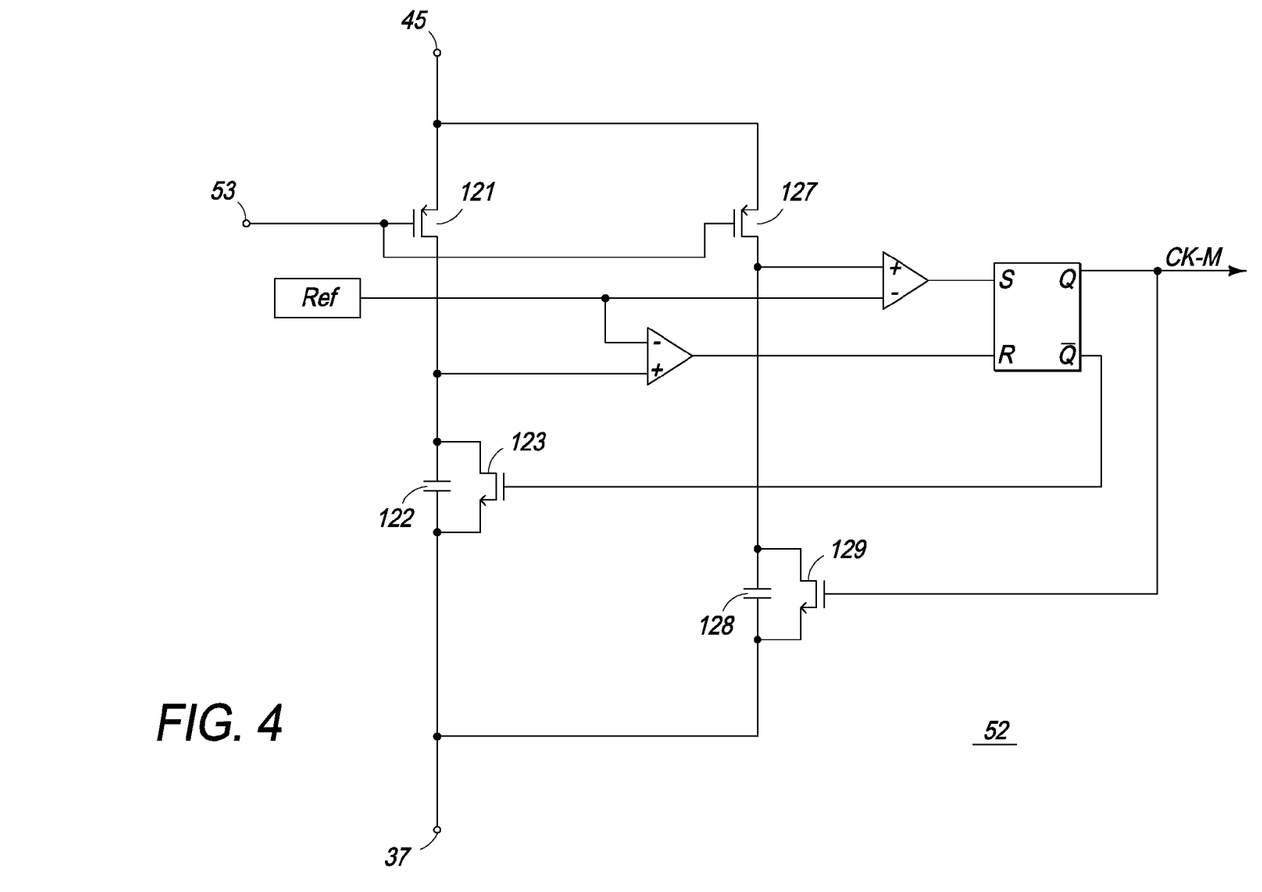
FIG. 4 schematically illustrates an embodiment of a portion of one clock generator of the PWM controller of FIG. 1 in accordance with the present invention.

FIG. 4 schematically illustrates an exemplary embodiment of a portion of clock generator circuit 52. Circuit 52 includes two timing circuits that are used to form the timing intervals for the CK-M signal. The first timing circuit includes a bias transistor 121, a capacitor 122, and a discharge transistor 123. The second timing circuit includes a bias transistor 127, a capacitor 128, and a discharge transistor 129. Transistors 121 and 127 establish charging currents there used for charging respective capacitors 122 and 128. Circuit 52 receives the control signal from node 84 on input 53 which adjust the value of the gate-to-source voltage of transistors 121 and 127 thereby changing the charging currents that are used for charging capacitors 122 and 128. As the charging currents change, the time intervals also change which change the frequency of the CK-M signal.

Figure 5:
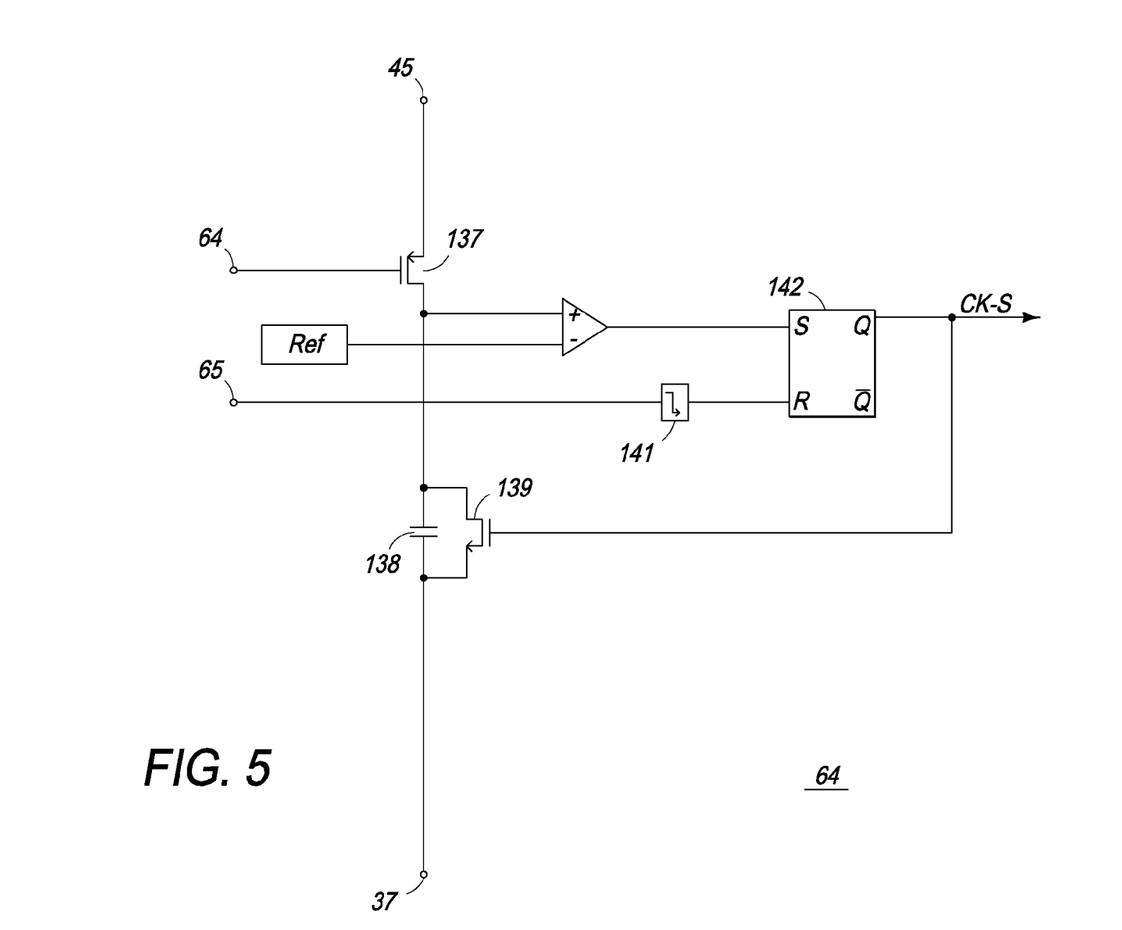
FIG. 5 schematically illustrates an embodiment of a portion of another clock generator of the PWM controller of FIG. 1 accordance with the present invention.

FIG. 5 schematically illustrates an exemplary embodiment of a portion of clock generator circuit 63. Circuit 63 has a single timing circuit that includes a bias transistor 137, a switch transistor 139, and a timing capacitor 138 that adjusts the period of the CK-S signal. Circuit 63 receives the control voltage from node 84 on input 64 which adjusts the value of the gate-to-source voltage of transistor 137. Circuit 63 also includes a synchronizing input 65 that is used to reset a latch 142 upon the negative going edge of the signal received on input 65. Negative edge detector 141 detects the negative edge and resets latch 142.

Figure 6:
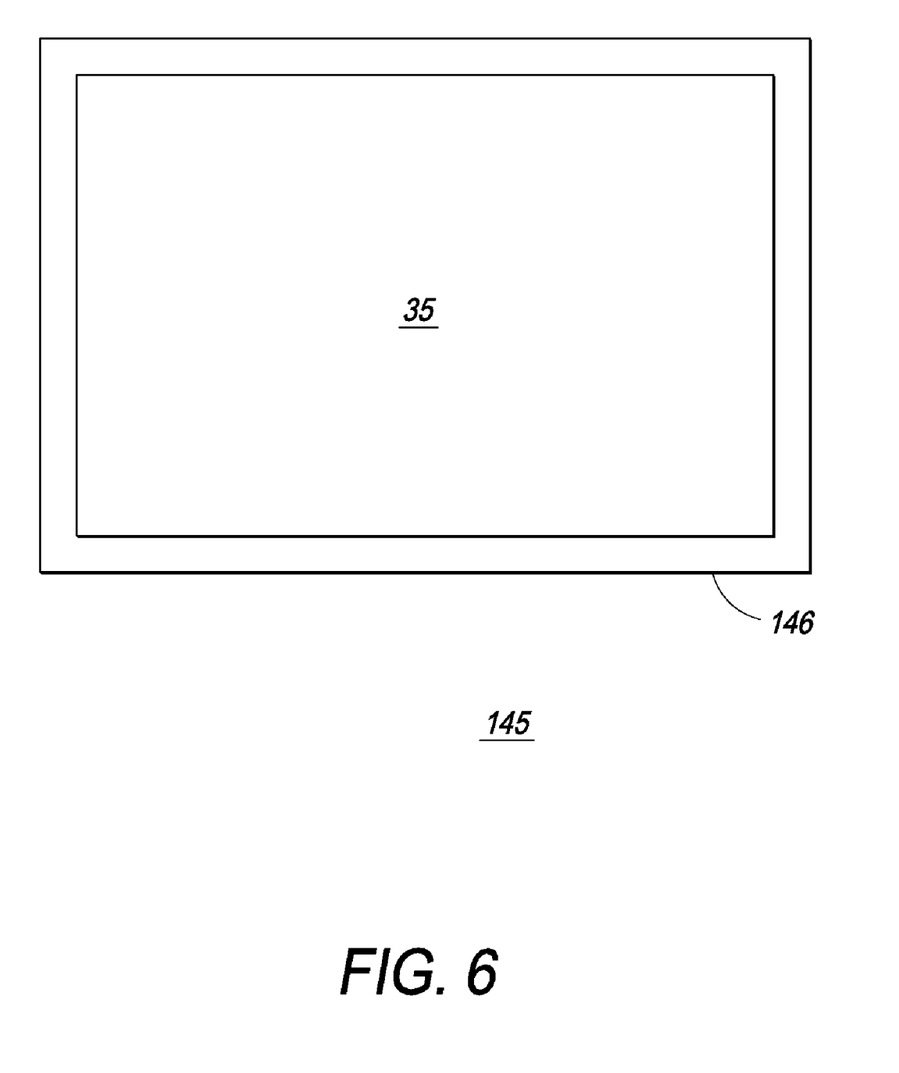
FIG. 6 schematically illustrates an enlarged plan view of a semiconductor device that includes the PWM controller of FIG. 1 in accordance with the present invention.

FIG. 6 schematically illustrates an enlarged plan view of a portion of an embodiment of a semiconductor device or integrated circuit 145 that is formed on a semiconductor die 146. Controller 35 is formed on die 146. Die 146 may also include other circuits that are not shown in FIG. 6 for simplicity of the drawing. Controller 35 and device or integrated circuit 145 are formed on die 146 by semiconductor manufacturing techniques that are well known to those skilled in the art.

In view of all of the above, it is evident that a novel device and method is disclosed. Included, among other features, is forming a control voltage that is determined by the value of a component external to the PWM controller, and coupling using a plurality of timing circuits to selectively couple capacitor to receive the control voltage to minimize noise stored on the capacitor.

While the subject matter of the invention is described with specific preferred embodiments, it is evident that many alternatives and variations will be apparent to those skilled in the semiconductor arts. More specifically the subject matter of the invention has been described for a particular PNP and NPN transistor structure, although the method is directly applicable to other transistors. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A PWM controller comprising:
   an input;
   a first PWM control channel configured to form a first PWM drive signal to control a first switch and form a first output voltage;
   the first PWM control channel including a first clock circuit configured to form a first clock signal that is used to form the first PWM drive signal wherein the first clock circuit is configured to adjust a frequency of the first clock signal responsively to a clock control signal;
   a second PWM control channel configured to form a second PWM drive signal to control a second switch and form a second output voltage;
   the second PWM control channel including a second clock circuit configured to form a second clock signal that is used to form the second PWM drive signal wherein the second clock circuit is configured to adjust a frequency of the second clock signal responsively to the clock control signal;
   a voltage to current converter circuit coupled to the input to supply a current to the input and form a control voltage;
   a capacitor coupled to selectively receive the control voltage to form the clock control signal;
   a first timing circuit configured to decouple the capacitor from receiving the control voltage responsively to the second clock signal;

a second timing circuit configured to decouple the capacitor from receiving the control voltage responsively to the second PWM drive signal; and a control circuit configured to decouple the capacitor from receiving the control voltage responsively to the first drive PWM signal.

2. The PWM controller of claim 1 wherein the voltage to current converter includes a first transistor, an amplifier having a first input coupled to receive a reference voltage and having a second input commonly coupled to the input and to a first current carrying electrode of the first transistor, the amplifier having an output coupled to a control electrode of the first transistor, the voltage to current converter including a second transistor having a first current carrying electrode coupled to a second current carrying electrode of the first transistor, a second current carrying electrode coupled to receive an operating voltage, and a control electrode coupled to form the control voltage.

3. The PWM controller of claim 2 further including a switch transistor having a first current carrying electrode coupled to the control electrode of the second transistor, a second current carrying electrode coupled to the capacitor, and a control electrode coupled to be controlled by the first timing circuit and the second timing circuit and the control circuit.

4. The PWM controller of claim 3 wherein the capacitor has a first terminal coupled to selectively receive the control voltage and a second terminal coupled to an operating voltage of the PWM controller.

5. The PWM controller of claim 3 wherein the first timing circuit includes a first timing capacitor having a first terminal coupled to a first current carrying electrode of a third transistor and having a second terminal coupled to a second current carrying electrode of the third transistor, the third transistor having a control electrode coupled to receive a signal representative of an edge of the second clock signal.

6. The PWM controller of claim 5 wherein the second timing circuit includes a second timing capacitor having a first terminal coupled to a first current carrying electrode of a fourth transistor and having a second terminal coupled to a second current carrying electrode of the fourth transistor, the fourth transistor having a control electrode coupled to receive a signal representative of an edge of the second PWM drive signal.

7. The PWM controller of claim 6 wherein the first timing circuit includes a third timing capacitor having a first terminal coupled to a first current carrying electrode of a fifth transistor and having a second terminal coupled to a second current carrying electrode of the fifth transistor, the fifth transistor having a control electrode coupled to receive a timing signal from the first timing circuit.

8. The PWM controller of claim 7 wherein the control circuit includes a logic gate coupled to receive a timing signal from the second timing circuit, a timing signal from a third timing circuit, and the first PWM drive signal.

9. A method of forming a PWM controller comprising:
configuring the PWM controller with a first PWM channel that includes a first clock circuit that forms a first clock signal that is used to establish one of a beginning or an end of a first PWM drive signal of the PWM controller, wherein the first PWM drive signal is used to regulate a first output voltage;

coupling a sense circuit of the PWM controller to form a sense voltage on an input of the PWM controller and to form a control voltage responsively to a current that results from the sense voltage;

configuring a signal conditioning circuit to couple the control voltage to a sense capacitor to form a control signal on the sense capacitor and to decouple the sense capacitor from the control voltage responsively to the first PWM drive signal; and configuring the first clock circuit to receive the control signal and responsively control a frequency of the first clock signal.

10. The method of claim 9 wherein configuring the signal conditioning circuit to couple the sense voltage to the sense capacitor to form the control signal on the sense capacitor and to decouple the sense capacitor from the sense voltage responsively to the first PWM drive signal includes coupling a switch transistor to receive the control voltage and to couple the control voltage to the sense capacitor.

11. The method of claim 9 wherein the PWM controller includes a second PWM channel that includes a second clock circuit that forms a second clock signal that is used to establish one of a beginning or an end of a second PWM drive signal of the PWM controller, wherein the second PWM drive signal is used to regulate a second output voltage, and configuring the second clock circuit to receive the control signal and responsively control a frequency of the second clock signal.

12. The method of claim 11 further including configuring the signal conditioning circuit to decouple the sense capacitor from the sense voltage responsively to an edge of the second PWM drive signal and responsively to an edge of the second clock signal.

13. The method of claim 12 further including configuring a first timing circuit to decouple the sense capacitor from receiving the control voltage responsively to the second clock signal and configuring a second timing circuit to decouple the sense capacitor from receiving the control voltage responsively to the second PWM drive signal.

14. The method of claim 13 further including configuring a control circuit to decouple the sense capacitor from receiving the control voltage responsively to the first PWM drive signal.

15. The method of claim 9 wherein coupling the sense circuit of the PWM controller to form the sense voltage on the input of the PWM controller and to form the control voltage responsively to the current that results from the sense voltage includes coupling a voltage to current converter to form the sense voltage on the input and to supply the current to the output responsively to a value of a resistor that is to be coupled to the input and further including coupling a transistor to receive the current and form the control voltage responsively to a value of the current.

16. The method of claim 9 wherein configuring the signal conditioning circuit to couple the sense voltage to the sense capacitor to form the control signal on the sense capacitor and to decouple the sense capacitor from the sense voltage responsively to the first PWM drive signal includes coupling a switch transistor to receive the control voltage and to couple the control voltage to the sense capacitor.

* * * * *